United States Patent
Toba et al.

(10) Patent No.: US 8,736,025 B2
(45) Date of Patent: May 27, 2014

(54) III-NITRIDE SEMICONDUCTOR GROWTH SUBSTRATE, III-NITRIDE SEMICONDUCTOR EPITAXIAL SUBSTRATE, III-NITRIDE SEMICONDUCTOR ELEMENT, III-NITRIDE SEMICONDUCTOR FREESTANDING SUBSTRATE ALL HAVING IMPROVED CRYSTALLINITY

(75) Inventors: Ryuichi Toba, Chiyoda-ku (JP); Masahito Miyashita, Chiyoda-ku (JP); Tatsunori Toyota, Chiyoda-ku (JP)

(73) Assignees: Dowa Electroncs Materials Co., Ltd., Tokyo (JP); Dowa Holdings Co., Ltd., Tokyo (JP)

( * ) Notice: Subject to any disclaimer, the term of this patent is extended or adjusted under 35 U.S.C. 154(b) by 298 days.

(21) Appl. No.: 13/142,115

(22) PCT Filed: Dec. 25, 2009

(86) PCT No.: PCT/JP2009/071903
§ 371 (c)(1),
(2), (4) Date: Jul. 1, 2011

(87) PCT Pub. No.: WO2010/074346
PCT Pub. Date: Jul. 1, 2010

(65) Prior Publication Data
US 2011/0254135 A1    Oct. 20, 2011

(30) Foreign Application Priority Data

Dec. 26, 2008  (JP) ................................ 2008-332659
Dec. 25, 2009  (JP) ................................ 2009-293875

(51) Int. Cl.
*H01L 29/20* (2006.01)
(52) U.S. Cl.
USPC .................... 257/615; 438/478; 257/E29.089
(58) Field of Classification Search
USPC ................. 257/E21.09, E33.023, E31.007, 257/E31.027, 615, E29.089, 79–103; 438/478–509
See application file for complete search history.

(56) References Cited

U.S. PATENT DOCUMENTS 6,824,610 B2 * 11/2004 Shibata et al. .................. 117/89
6,884,646 B1    4/2005 Wu et al.
(Continued)

FOREIGN PATENT DOCUMENTS

CN    1378238 A    11/2002
CN    1538535 A    10/2004
(Continued)

OTHER PUBLICATIONS

May 23, 2013 Notice of Preliminary Rejection issued in Korean Application No. 10-2011-7016554 with English-language translation.

(Continued)

*Primary Examiner* — Julio J Maldonado
*Assistant Examiner* — Robert Bachner
(74) *Attorney, Agent, or Firm* — Oliff PLC (57) ABSTRACT

An object of the present invention is to address the problems described herein and to provide a III-nitride semiconductor epitaxial substrate, a III-nitride semiconductor element, and a III-nitride semiconductor freestanding substrate, which have good crystallinity, not only with AlGaN, GaN, or GaInN, the growth temperature of which is at or below 1050° C., but also with $Al_xGa_{1-x}N$, the growth temperature of which is high and which has a high Al composition, as well as a III-nitride semiconductor growth substrate for fabricating these and a method for efficiently fabricating these. The invention is characterized by being equipped with: a crystal growth substrate, at least the surface portion of which substrate includes a III-nitride semiconductor containing Al; and a single metallic layer formed on the surface portion, the single metallic layer being made from Zr or Hf.

8 Claims, 6 Drawing Sheets

(56) References Cited

U.S. PATENT DOCUMENTS

2003/0207125 A1* 11/2003 Sunakawa et al. ............ 428/428
2004/0206967 A1* 10/2004 Oshima et al. ................. 257/85

FOREIGN PATENT DOCUMENTS

| | | |
|---|---|---|
| CN | 1998065 A | 7/2007 |
| EP | 1 246 233 A2 | 10/2002 |
| EP | 1 523 033 A1 | 4/2005 |
| JP | A-2000-261031 | 9/2000 |
| JP | A-2002-284600 | 10/2002 |
| JP | A-2003-224072 | 8/2003 |
| JP | A-2005-268642 | 9/2005 |
| JP | A-2006-210578 | 8/2006 |
| JP | A-2008-91728 | 4/2008 |
| JP | A-2008-91729 | 4/2008 |
| JP | A-2009-54888 | 3/2009 |
| WO | WO 2006/126330 A1 | 11/2006 |

OTHER PUBLICATIONS

Mar. 30, 2010 Office Action issued in Japanese Patent Application No. 2009-293875 (with translation).
Sep. 7, 2010 Office Action issued in Japanese Patent Application No. 2009-293875 (with translation).
Jun. 21, 2011 Office Action issued in Japanese Patent Application No. 2009-293875 (with translation).
Jun. 7, 2013 extended European Search Report issued in European Patent Application No. 09835125.7.
Chinese Office Action issued in Chinese Patent Application No. 200980157430.1 on Mar. 5, 2013 (with translation).
Dec. 3, 2013 Office Action issued in Japanese Application No. 2010-273024 (with English Translation).

* cited by examiner

III-NITRIDE SEMICONDUCTOR GROWTH SUBSTRATE, III-NITRIDE SEMICONDUCTOR EPITAXIAL SUBSTRATE, III-NITRIDE SEMICONDUCTOR ELEMENT, III-NITRIDE SEMICONDUCTOR FREESTANDING SUBSTRATE ALL HAVING IMPROVED CRYSTALLINITY

TECHNICAL FIELD

The present invention generally relates to a III-nitride semiconductor growth substrate, a III-nitride semiconductor epitaxial substrate, a III-nitride semiconductor element, a III-nitride semiconductor freestanding substrate and a method for fabricating these.

RELATED ART

Generally, for example, III-nitride semiconductor elements including III-nitride semiconductors composed of compounds of Al, Ga or the like and N have been widely used as light emitting elements or elements for electronic devices. Currently, such III-nitride semiconductors are commonly formed on a crystal growth substrate composed of, e.g., sapphire by the MOCVD method.

However, since the lattice constants of the III-nitride semiconductors and the crystal growth substrate (generally sapphire) significantly differ, there is a problem that dislocation is caused by difference in lattice constant, which can degrade crystal quality of any III-nitride semiconductor layer grown on the crystal growth substrate.

To address this problem, there is a conventional art technology, for example, to grow a GaN layer on a sapphire substrate via a buffer layer in a low-temperature polycrystalline or amorphous state. However, because the GaN layer thus formed involves a dislocation density as large as $10^9$ to $10^{10}$ cm$^{-2}$, it was difficult to obtain sufficient crystallinity.

In addition, there are other conventional art technologies to grow a GaN layer on a sapphire substrate via a metal nitride layer, as disclosed in Patent Documents 1 to 3 below. This method allows for a reduction in dislocation density of GaN layers and growth of high-quality GaN layers as compared with the above-mentioned technology. This is because a CrN layer or the like which is a metal nitride layer and a GaN layer have a relatively small difference in their lattice constants and thermal expansion coefficients. In addition, this CrN layer, which can be selectively etched by chemical etching liquid, is useful for processes utilizing chemical lift-off.
Patent Document 1: WO2006/126330
Patent Document 2: JP-A-2008-91728
Patent Document 3: JP-A-2008-91729

DISCLOSURE OF THE INVENTION

Problems to be Solved by the Invention

However, in nitride semiconductor elements for generating light in a shorter wavelength region than that of blue light (e.g., a wavelength of 400 nm or less), the nitride semiconductor elements should involve $Al_xGa_{1-x}N$ layers with a higher Al composition as the light to be generated has a shorter wavelength. $Al_xGa_{1-x}N$ with an Al composition of generally greater than 30 at % has growth temperatures higher than about 1050° C., which is the melting point of CrN. Thus, if a III-nitride semiconductor layer containing $Al_xGa_{1-x}N$ with an Al composition of generally greater than 30 at % is grown by means of CrN, then CrN is melted and loses its crystallinity. This can lower crystallinity of a III-nitride semiconductor layer formed thereon. Accordingly, CrN cannot be used as a buffer layer for growing $Al_xGa_{1-x}N$ with a higher Al composition and thus with a higher growth temperature. As such, it is necessary to employ such material that can tolerate heat treatment at high temperatures higher than 1050° C. In addition, when a CrN layer is formed as a metal nitride layer, another problem arises that the yield and throughput may be reduced since it undergoes a nitridation process, leading to higher production costs.

An object of the present invention is to address these problems and to provide a III-nitride semiconductor epitaxial substrate, a III-nitride semiconductor element, and a III-nitride semiconductor freestanding substrate, which have good crystallinity, not only with AlGaN, GaN, or GaInN, the growth temperature of which is at or below 1050° C., but also with $Al_xGa_{1-x}N$, the growth temperature of which is high and which has a high Al composition, as well as a III-nitride semiconductor growth substrate for fabricating these and a method to efficiently fabricate these.

Means for Solving the Problem

To achieve the above-mentioned object, the present invention has general features as follows:

(1) A III-nitride semiconductor growth substrate comprising: a crystal growth substrate, at least a surface portion of which substrate includes a III-nitride semiconductor containing Al; and a single metallic layer formed on the surface portion, the single metallic layer being made from Zr or Hf.

(2) The III-nitride semiconductor growth substrate according to (1) further comprising: an initial growth layer including at least one buffer layer made from $Al_xGa_{1-x}N$ (0≤x≤1) on the single metallic layer.

(3) The III-nitride semiconductor growth substrate according to (1) or (2), wherein the single metallic layer has a thickness of 5 to 100 nm.

(4) The III-nitride semiconductor growth substrate according to (1), (2) or (3), wherein at least the surface portion is made from $Al_xGa_{1-x}N$ (0.5≤x≤1) with an Al composition of 50 at % or more.

(5) The III-nitride semiconductor growth substrate according to (1), (2) or (3), wherein at least the surface portion is made from AlN.

(6) A III-nitride semiconductor epitaxial substrate comprising at least one III-nitride semiconductor layer on the III-nitride semiconductor growth substrate according to any one of (1) to (5).

(7) A III-nitride semiconductor freestanding substrate fabricated by using the III-nitride semiconductor growth substrate according to any one of (1) to (5).

(8) A III-nitride semiconductor element fabricated by using the III-nitride semiconductor growth substrate according to any one of (1) to (5).

(9) A method for fabricating a III-nitride semiconductor growth substrate, the method comprising: forming a single metallic layer made from Zr or Hf material on a crystal growth substrate, at least a surface portion of which substrate includes a III-nitride semiconductor containing Al; and performing heat treatment on the single metallic layer under a hydrogen atmosphere.

(10) The method for fabricating the III-nitride semiconductor growth substrate according to (9), wherein the method further comprises: after performing the heat treatment, forming an initial growth layer including at least one buffer layer made from $Al_xGa_{1-x}N$ (0≤x≤1) on the single metallic layer.

(11) A method for fabricating a III-nitride semiconductor element, comprising the steps of: forming a single metallic layer made from Zr or Hf material on a crystal growth substrate, at least a surface portion of which substrate includes a III-nitride semiconductor containing Al; performing heat treatment on the single metallic layer under a hydrogen atmosphere to fabricate a III-nitride semiconductor growth substrate; epitaxially growing at least one III-nitride semiconductor layer over the III-nitride semiconductor growth substrate to fabricate a III-nitride semiconductor epitaxial substrate; performing a device isolation process on the least one III-nitride semiconductor layer; forming a support substrate at the side of the III-nitride semiconductor layer; and selectively etching the single metallic layer so that the III-nitride semiconductor layer is separated from the crystal growth substrate by chemical lift-off to obtain a III-nitride semiconductor element.

(12) The method for fabricating the III-nitride semiconductor element according to (11), wherein fabricating the III-nitride semiconductor epitaxial substrate comprises growing the III-nitride semiconductor layer within the highest temperature range of 900 to 1300° C.

(13) The method for fabricating the III-nitride semiconductor element according to (11), wherein fabricating the III-nitride semiconductor epitaxial substrate comprises growing the III-nitride semiconductor layer within the highest temperature range of 1050 to 1300° C.

(14) The method for fabricating the III-nitride semiconductor element according to (11), (12) or (13), wherein the method further comprises: after performing the heat treatment, forming an initial growth layer including at least one buffer layer made from $Al_xGa_{1-x}N$ ($0 \leq x \leq 1$) on the single metallic layer.

(15) The method for fabricating the III-nitride semiconductor element according to (14), wherein the initial growth layer comprises a first buffer layer and a second buffer layer grown on the first buffer layer, wherein a growth temperature of the first buffer layer ranges from 900 to 1260° C. and a growth temperature of the second buffer layer ranges from 1030 to 1300° C., and wherein the growth temperature of the first buffer layer is equal to or lower than the growth temperature of the second buffer layer.

(16) A method for fabricating a III-nitride semiconductor freestanding substrate, comprising the steps of: forming a single metallic layer made from Zr or Hf on a crystal growth substrate, at least a surface portion of which substrate includes a III-nitride semiconductor containing Al; performing heat treatment on the single metallic layer under a hydrogen atmosphere to fabricate a III-nitride semiconductor growth substrate; epitaxially growing at least one III-nitride semiconductor layer over the III-nitride semiconductor growth substrate; and selectively etching the single metallic layer so that the III-nitride semiconductor layer is separated from the crystal growth substrate by chemical lift-off to obtain a III-nitride semiconductor freestanding substrate.

(17) The method for fabricating the III-nitride semiconductor freestanding substrate according to (16), wherein fabricating the III-nitride semiconductor epitaxial substrate comprises growing the III-nitride semiconductor layer within the highest temperature range of 900 to 1300° C.

Effect of the Invention

The III-nitride semiconductor growth substrate of the present invention comprises: a crystal growth substrate, at least a surface portion of which substrate includes a III-nitride semiconductor containing Al; and a single metallic layer formed on the surface portion, the single metallic layer being made from Zr or Hf. This may suppress the reduction in surface flatness of the single metallic layer, improve the crystallinity of a III-nitride semiconductor layer, $Al_xGa_yIn_{1-x-y}N$ ($0 \leq x \leq 1$, $0 \leq y \leq 1$, $0 \leq x+y \leq 1$) to be subsequently formed thereon, and allow the crystal growth substrate to be peeled off with ease from the III-nitride semiconductor layer by chemical lift-off.

In addition, according to the present invention, the III-nitride semiconductor growth substrate may be used to provide a III-nitride semiconductor epitaxial substrate, a III-nitride semiconductor element, and a III-nitride semiconductor freestanding substrate, which have good crystallinity and covers the entire wavelength range (200 nm to 1.5 µm) that can be covered by III-nitride semiconductor material beyond the wavelength limit for CrN material.

Moreover, the present invention comprises: forming a single metallic layer made from Zr or Hf material on a crystal growth substrate, at least a surface portion of which substrate includes a III-nitride semiconductor containing Al; and performing heat treatment on the single metallic layer under a hydrogen atmosphere. This enables fabrication of a III-nitride semiconductor growth substrate that may suppress the reduction in surface flatness of a single metallic layer, improve the crystallinity of a III-nitride semiconductor layer, $Al_xGa_yIn_{1-x-y}N$ ($0 \leq x \leq 1$, $0 \leq y \leq 1$, $0 \leq x+y \leq 1$), to be subsequently formed thereon, and allow the crystal growth substrate to be peeled off with ease from the III-nitride semiconductor layer by chemical lift-off.

Additionally, according to the present invention, a chemical lift-off method may be carried out by means of the III-nitride semiconductor growth substrate, which enables efficient fabrication of a III-nitride semiconductor epitaxial substrate, a III-nitride semiconductor element, and a III-nitride semiconductor freestanding substrate, which have good crystallinity and cover the entire wavelength range (200 nm to 1.5 µm) that can be covered by III-nitride semiconductor material beyond the wavelength limit for CrN material.

BEST MODE FOR CARRYING OUT THE INVENTION

Figure 1:
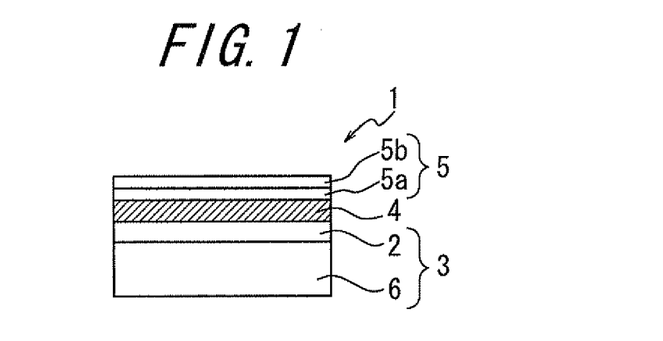
FIG. 1 is a diagrammatic representation illustrating a cross-sectional structure of a nitride semiconductor substrate according to the present invention.

Embodiments of a III-nitride semiconductor growth substrate according to the present invention will now be described below with reference to the accompanying drawings. As used herein, according to the present invention, a III-nitride semiconductor epitaxial substrate results from the above-mentioned III-nitride semiconductor growth substrate with at least one III-nitride semiconductor layer grown thereon; a III-nitride semiconductor element results from the III-nitride semiconductor epitaxial substrate being subjected to a device processing, such as electrode deposition, to achieve device isolation; and a III-nitride semiconductor freestanding substrate results from the III-nitride semiconductor growth substrate with a III-nitride semiconductor layer having a thickness of several hundreds μm or more grown thereon, after which the III-nitride semiconductor growth substrate is peeled off. FIG. 1 diagrammatically illustrates a cross-sectional structure of a III-nitride semiconductor growth substrate according to the present invention.

The III-nitride semiconductor growth substrate 1 illustrated in FIG. 1 comprises: a crystal growth substrate 3, at least a surface portion of which substrate, in FIG. 1, a surface portion 2, includes a III-nitride semiconductor containing at least Al; and a single metallic layer 4 formed on the surface portion 2, the single metallic layer being made from Zr or Hf material. Such a configuration may suppress the reduction in surface flatness of the single metallic layer 4, improve the crystallinity of the metallic layer by the subsequent heat treatment as well as the crystallinity of a III-nitride semiconductor layer to be formed thereon, and allow the crystal growth substrate 3 to be peeled off from the III-nitride semiconductor layer by chemical lift-off. It should be noted that the hatching in the figures is for ease of illustration and for convenience.

Preferably, the III-nitride semiconductor growth substrate 1 further comprises an initial growth layer 5 including at least one layer made from $Al_xGa_{1-x}N$ ($0 \leq x \leq 1$), in FIG. 1 two buffer layers 5a, 5b, formed on the single metallic layer 4. This is provided for improving the crystallinity of a nitride semiconductor layer to be formed thereon. The Al composition of these buffer layers may be selected as appropriate depending on the material formed thereon.

The crystal growth substrate 3 may be, for example, a template substrate or an AlN single-crystal substrate having on a base substrate 6 a III-nitride semiconductor 2 containing at least Al, such as sapphire, Si, SiC or GaN, or alternatively, a surface-nitriding sapphire substrate formed by nitriding the surface of sapphire. FIG. 1 illustrates a case where the crystal growth substrate 3 is an AlN template substrate having a AlN single-crystal layer 2 on a sapphire substrate 6. This surface portion 2 that includes a III-nitride semiconductor containing at least Al has an advantage of reducing crystal defects of an AlGaN layer to be grown thereon.

Preferably, at least the surface portion 2 of the crystal growth substrate 3 is made from $Al_xGa_{1-x}N$ with an Al composition of 50 at % or more ($0.5 \leq x \leq 1$), and more preferably, $Al_xGa_{1-x}N$ with 80 at % or more ($0.8 \leq x \leq 1$). This is because the surface portion 2 having an Al composition equivalent to that of a III-nitride semiconductor layer to be formed thereon permits homoepitaxial growth, thereby allowing the growth of such a layer that has good crystallinity and reduced dislocation defect density. In addition, above the Al composition of a III-nitride semiconductor layer to be formed thereon, at least the surface portion 2 is preferably made from AlN. This is because such an effect can then be expected to cause further reduction in dislocation due to the compressive stress, and because AlN has the highest growth temperature among the III-nitride semiconductor materials without any degradation during the growth of a III-nitride semiconductor layer to be grown thereon.

It is assumed here that the single metallic layer 4 is made from Zr or Hf. This is because the Zr or Hf material has a high melting point and exhibits excellent physical properties as a single metallic layer of the present invention. This is also because if at least the surface portion 2 of the crystal growth substrate 3 is a III-nitride semiconductor material containing Al, then it has a hexagonal closest packing (hcp) structure which is the same as the crystal structure of this III-nitride semiconductor containing Al, and hence it involves a lattice constant and a linear expansion coefficient along an a axis that are close to those of said III-nitride semiconductor containing Al.

Preferably, the single metallic layer 4 has a thickness of 5 to 100 nm. Below 5 nm, the single metallic layer 4 is too thin to accept etching liquid, or the thickness of the single metallic layer becomes discontinuous due to heat treatment, leading to exposure of the surface of the crystal growth substrate, which is the base substrate. This would result in, for example, direct formation of a III-nitride semiconductor layer on the crystal growth substrate, which makes it difficult to achieve chemical lift-off. On the other hand, above 100 nm, high crystallization cannot be achieved by the solid-phase epitaxy of the single metallic layer itself, which results in reduced crystallinity of the III-nitride semiconductor layer thereon and increased defects. In addition, this single metallic layer 4 may be deposited on the crystal growth substrate 3 by using a method such as a sputtering or vacuum evaporation method.

Although not illustrated in FIG. 1, a III-nitride semiconductor epitaxial growth substrate according to the present invention may be obtained by providing at least one III-nitride semiconductor layer on the III-nitride semiconductor growth substrate 1 with the above-described structure.

Similarly, although not illustrated in FIG. 1, the III-nitride semiconductor growth substrate 1 with the above-described structure may be used to obtain a III-nitride semiconductor freestanding substrate and a III-nitride semiconductor element according to the present invention.

Embodiments of a method for fabricating the III-nitride semiconductor growth substrate of the present invention will now be described below with reference to the drawings.

As illustrated in FIG. 1, the method for fabricating the III-nitride semiconductor growth substrate 1 of the present invention comprises: forming the single metallic layer 4 made from Zr or Hf material on the crystal growth substrate 3, at least the surface portion 2 of which includes a III-nitride semiconductor containing Al; and performing heat treatment on the single metallic layer 4 under a hydrogen atmosphere. Such a configuration may suppress the reduction in surface flatness of the single metallic layer 4, improve the crystallinity of the metallic layer by the subsequent heat treatment as well as the crystallinity of a III-nitride semiconductor layer to be formed thereon, and allow the crystal growth substrate 3 to be peeled off from the III-nitride semiconductor layer by chemical lift-off.

Preferably, heat treatment is performed under a hydrogen atmosphere, at temperatures between 1000 to 1300° C., at pressures between 50 to 760 Torr and for times between 1 to 60 minutes. This is for crystallizing the single metallic layer 4 by the solid-phase epitaxy and improving the crystallinity of a III-nitride semiconductor layer to be subsequently grown on the single metallic layer.

After the step of performing heat treatment, the method preferably comprises forming an initial growth layer 5 including at least one buffer layer made from $Al_xGa_{1-x}N$ material ($0 \leq x \leq 1$) on the single metallic layer 4. This is for improving the crystallinity of a III-nitride semiconductor layer to be formed subsequently. In view of preferred growth temperatures for GaN are 900 to 1100° C. and preferred growth temperatures for AlN are 1000 to 1300° C., and because $Al_xGa_{1-x}N$ material ($0<x<1$) is a mixed crystal of GaN and AlN, $Al_xGa_{1-x}N$ material ($0<x<1$) is preferably formed at growth temperatures between 900 to 1300° C.

The III nitride semiconductor growth substrate 1 according to the present invention may be fabricated by using the above-described method.

Figure 2:
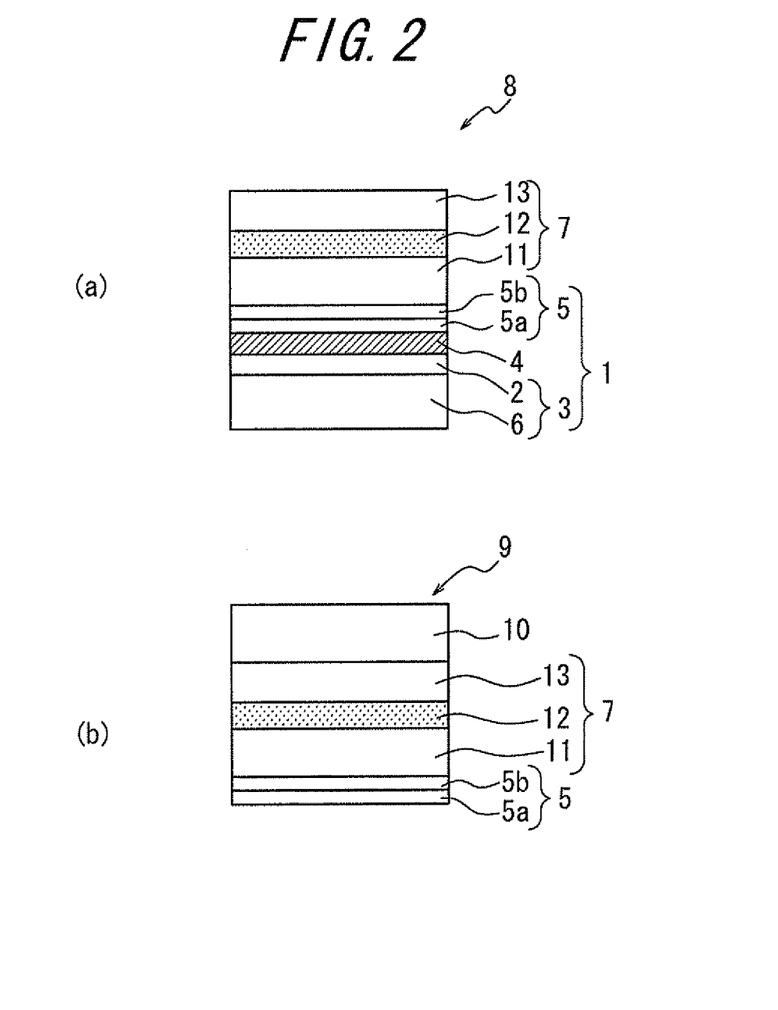
FIG. 2 is a diagrammatic representation illustrating a process of fabricating a nitride semiconductor element structure according to the present invention.

Next, as illustrated in FIG. 2(a), a method for fabricating a III-nitride semiconductor epitaxial substrate 8 of the present invention comprises epitaxially growing at least one III-nitride semiconductor layer 7 over the III-nitride semiconductor growth substrate 1 fabricated by the above-described method. Such a configuration enables fabrication of a III-nitride semiconductor epitaxial substrate which has good crystallinity and covers the entire wavelength range (200 nm to 1.5 µm) that can be covered by III-nitride semiconductor material beyond the wavelength limit for CrN material.

Since a III-nitride semiconductor layer 7 contains any of GaN, $Al_xGa_{1-x}N$ material ($0<x<1$) or AlN, it is preferably grown by, e.g., the MOCVD, HVPE or MBE method within the highest temperature range of 900 to 1300° C. It may be grown even within the highest temperature range of 1050 to 1300° C. Accordingly, it is more preferable because, unlike CrN material being used, there is no restriction on III-nitride semiconductor material capable of being lifted-off and its growth conditions.

Preferably, after the step of performing heat treatment, the method further comprises forming an initial growth layer 5 including at least one buffer layer made from $Al_xGa_{1-x}N$ material ($0 \leq x \leq 1$) on the single metallic layer 4. This is for improving the crystallinity of a III-nitride semiconductor layer 7 to be subsequently formed, the growth temperature of which preferably ranges from 900 to 1300° C.

The initial growth layer 5 comprises a first buffer layer 5a and a second buffer layer 5b grown on the first buffer layer 5a. Preferably, the growth temperature of the first buffer layer 5a ranges from 900 to 1260° C., the growth temperature of the second buffer layer 5b ranges from 1030 to 1300° C., and the growth temperature of the first buffer layer 5a is lower than that of the second buffer layer 5b. This is for growing a first buffer layer 5a at a relatively low temperature at an initial growth stage, during which the first buffer layer 5a is being grown, to facilitate formation of many initial growth nuclei for improved crystallinity, followed by increasing the growth temperature at the time of growing a second buffer layer 5b to fill up any grooves/dimples formed between these many initial nuclei for improved crystallinity and flatness. In addition, there may be three or more buffer layers, and in which case it is preferable to sequentially increase the growth temperature.

The III-nitride semiconductor epitaxial substrate 8 according to the present invention may be fabricated by the above-described method.

Next, as illustrated in FIGS. 2(a) and 2(b), a method for fabricating a III-nitride semiconductor element 9 of the present invention comprises: performing a device isolation process on the III-nitride semiconductor epitaxial substrate 8 fabricated by the above-described method to isolate at least one III-nitride semiconductor layer 7; forming a support substrate 10 at the side of the III-nitride semiconductor layer 7; and selectively etching the single metallic layer 4 so that the III-nitride semiconductor layer 7 (in FIG. 2(b), the III-nitride semiconductor layer 7 and the buffer layer 5) is/are separated from the crystal growth substrate 3 by chemical lift-off to obtain the III-nitride semiconductor element 9. Such a configuration enables efficient fabrication of a III-nitride semiconductor element which has good crystallinity and covers the entire wavelength range (200 nm to 1.5 µm) that can be covered by III-nitride semiconductor material beyond the wavelength limit for CrN material.

As illustrated in FIGS. 2(a) and 2(b), at least the one III-nitride semiconductor layer 7 may be, for example, an n-AlGaN layer 11, an AlInGaN-based quantum well active layer 12 and a p-AlGaN layer 13. It should be noted that these III-nitride semiconductor layers 11, 12 and 13 may also be laminated in the reverse order of the conductivity type. In addition, the support substrate 10 is preferably formed by heat-dissipative material.

The III-nitride semiconductor element 9 according to the present invention may be fabricated by using the above-described method.

Next, a method for fabricating a III-nitride semiconductor freestanding substrate of the present invention comprises: epitaxially growing at least one III-nitride semiconductor layer over the III-nitride semiconductor growth substrate fabricated by the above-described method; and selectively etching the single metallic layer so that a III-nitride semiconductor layer is separated from a crystal growth substrate by chemical lift-off to obtain a III-nitride semiconductor freestanding substrate. Such a configuration enables efficient fabrication of a III-nitride semiconductor freestanding substrate which has good crystallinity and covers the entire wavelength range (200 nm to 1.5 µm) that can be covered by III-nitride semiconductor material beyond the wavelength limit for CrN material.

It is assumed that the III-nitride semiconductor layer has a thickness of 50 µm or more. This is for ensuring handling ability.

The III-nitride semiconductor freestanding substrate according to the present invention may be fabricated by using the above-described method.

It should be noted that the foregoing is only for illustration of representative embodiments and that the present invention is not intended to be limited to the embodiments.

EXAMPLE

Example 1

An AlN single-crystal substrate (1 µm thick) is grown on sapphire by means of the MOCVD method to fabricate an AlN template substrate as a nitride semiconductor growth substrate.

Single metallic layers are deposited on the resulting AlN template substrate by sputtering with metallic species and thickness as reported in Table 1 below. Then, heat treatment is performed thereon under a hydrogen atmosphere. Moreover, buffer layers (1 µm thick) made from AlN material are deposited on parts of these samples thus formed under certain conditions in order to obtain samples 1-1 to 1-6.

TABLE 1

| Sample No. | Metallic Species | Thickness (nm) | Heat Treatment Temperature (° C.) | Pressure (Torr) | Time (min) | Buffer Layer Growth Temperature (° C.) | Pressure (Torr) | |
|---|---|---|---|---|---|---|---|---|
| 1-1 | Zr | 20 | 1300 | 200 | 10 | none | | Example |
| 1-2 |    | 20 | 1300 | 200 | 10 | 1250 | 10 | Example |
| 1-3 | Hf | 20 | 1300 | 200 | 10 | none | | Example |
| 1-4 |    | 20 | 1300 | 200 | 10 | 1250 | 10 | Example |
| 1-5 | Cr | 20 | 1100 | 200 | 10 | none | | Comp. Ex. |
| 1-6 |    | 20 | 1100 | 200 | 10 | 1250 | 10 | Comp. Ex. |

(Evaluation)

Figure 3:
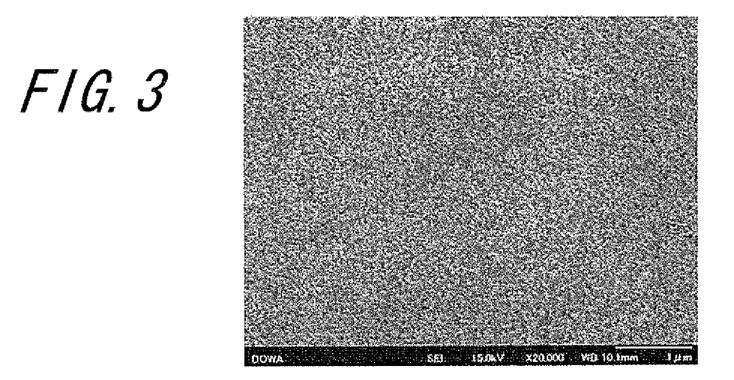
FIG. 3 illustrates a surface SEM image of a sample according to the present invention.
Figure 4:
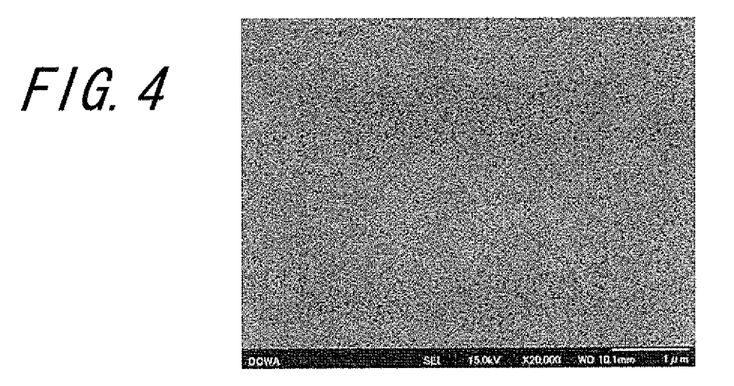
FIG. 4 illustrates a surface SEM image of a sample according to the present invention.
Figure 5:
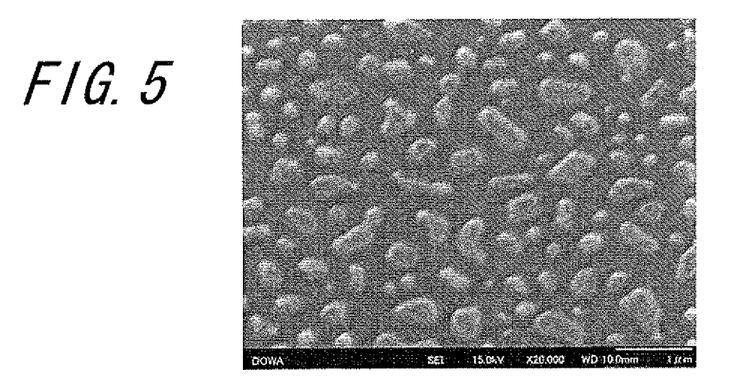
FIG. 5 illustrates a surface SEM image of a sample according to a conventional example.

For Samples 1-1 to 1-6, the surfaces are observed with SEM (Scanning Electron Microscope) at 5000 magnification. As a result, Samples 1-1 and 1-3 employing Zr and Hf as metallic species remain continuous and flat films even after the heat treatment under a hydrogen atmosphere without nitridation process, as illustrated in FIGS. 3 and 4. It is also found by 2θ/ω measurement with an X-ray diffractometer that these samples are crystallized. In contrast, as to Sample 1-5 employing Cr as metallic species, it is found that there are randomly scattered objects resulting from amorphous coagulation of Cr as illustrated in FIG. 5 so that the underlying AlN surface is exposed, which results in a significant reduction in the area covered by Cr. It is also found by 2θ/ω measurement with an X-ray diffractometer that Cr is in an amorphous state.

In addition, as to Samples 1-2 and 1-4, each having an AlN buffer layer formed on a single metallic layer, each AlN buffer layer becomes a single crystal and exhibits good flatness at the atomic level through AFM (Atomic Force Microscope). Moreover, upon immersion in hydrofluoric acid, the metallic layers can be etched with ease and chemical lift-off becomes available. In contrast, as to Sample 1-6, the AlN buffer layer grown on Cr exhibits very good crystallinity and flatness. However, it cannot be chemically lifted off even when immersed in Cr etching liquid. This is because if an AlN buffer layer is grown on a metallic layer having such a surface, then it homoepitaxially grows due to the direct contact with the underlying AlN layer, taking over the good crystallinity and flatness of the underlying AlN.

Example 2

As is the case with Example 1, single metallic layers are deposited on the AlN template substrate by sputtering with metallic species and thickness as reported in Table 2 below. Then, heat treatment under a hydrogen atmosphere or nitridation process under an atmosphere of hydrogen and ammonia is performed on parts of Samples thus formed as summarized in Table 2, or alternatively, buffer layers (1 μm) made from AlN material are further deposited under certain conditions in order to obtain samples 2-1 to 2-12.

TABLE 2

| Sample No. | Metallic Species | Thickness (nm) | Heat Treatment Tem. (° C.) | Press. (Torr) | Time (min) | Nitridation Process Tem. (° C.) | Press. (Torr) | Time (min) | Buffer Layer Tem. (° C.) | Press. (Torr) | V/III ratio | |
|---|---|---|---|---|---|---|---|---|---|---|---|---|
| 2-1 | Zr | 20 |  | none |  |  | none |  |  | none |  | Comp. Ex. |
| 2-2 |    | 20 |  | none |  | 1200 | 200 | 10 |  | none |  | Comp. Ex. |
| 2-3 |    | 20 | 1200 | 200 | 10 |  | none |  |  | none |  | Example |
| 2-4 |    | 20 |  | none |  | 1200 | 200 | 10 | 1250 | 12 | 120 | Comp. Ex. |
| 2-5 |    | 20 | 1200 | 200 | 10 |  | none |  | 1250 | 12 | 120 | Example |
| 2-6 | Hf | 20 |  | none |  |  | none |  |  | none |  | Comp. Ex. |
| 2-7 |    | 20 |  | none |  | 1200 | 200 | 10 |  | none |  | Comp. Ex. |
| 2-8 |    | 20 | 1200 | 200 | 10 |  | none |  |  | none |  | Example |
| 2-9 |    | 20 |  | none |  | 1200 | 200 | 10 | 1250 | 12 | 120 | Comp. Ex. |
| 2-10 |   | 20 | 1200 | 200 | 10 |  | none |  | 1250 | 12 | 120 | Example |
| 2-11 | Cr | 20 |  | none |  | 1200 | 200 | 10 |  | none |  | Comp. Ex. |
| 2-12 |   | 20 |  | none |  | 1200 | 200 | 10 | 1250 | 12 | 120 | Comp. Ex. |

(Evaluation)

Figure 6:
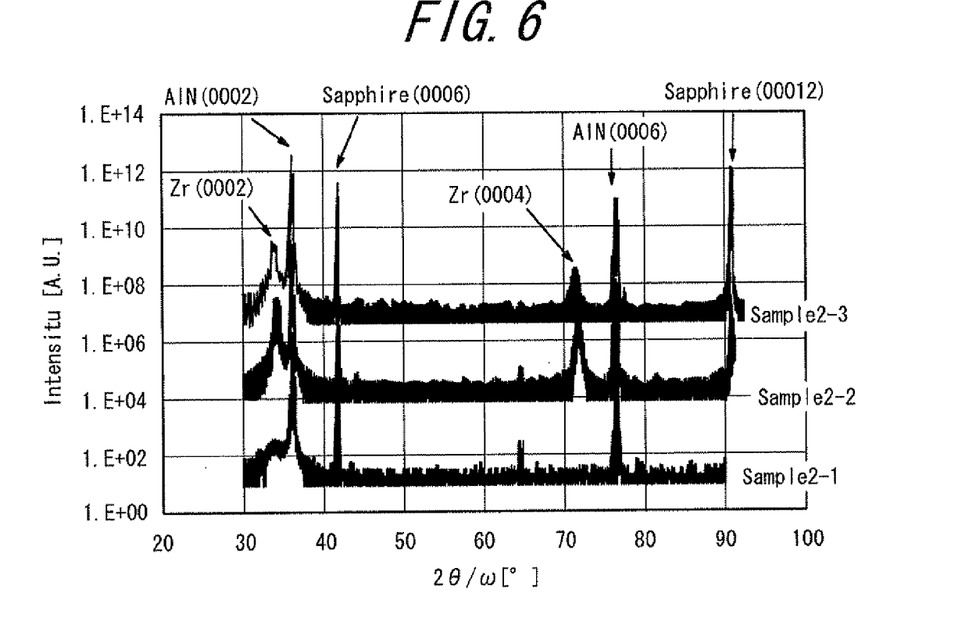
FIG. 6 is a graph illustrating the results of 2θ/ω scan measurement with an X-ray diffractometer.

To ascertain the crystallization and crystal orientation of metallic layers, 2θ/ω measurement is conducted with an X-ray diffractometer. As illustrated in FIG. 6, Sample 2-1, which remains intact since a single metallic layer Zr is deposited by sputtering, does not exhibit a diffraction peak of Zr and is found to be in an amorphous state. In contrast, Sample 2-3 exhibits diffraction peaks of Zr (0002) and (0004). It is then found that Zr metal is crystallized through the heat treatment under a hydrogen atmosphere. The peak of Sample 2-2 is slightly shifted to the high angle side as compared with Sample 2-3. It is believed that this comes from the fact that Sample 2-2 involves a trace of ZrN mixed with Zr.

Figure 7:
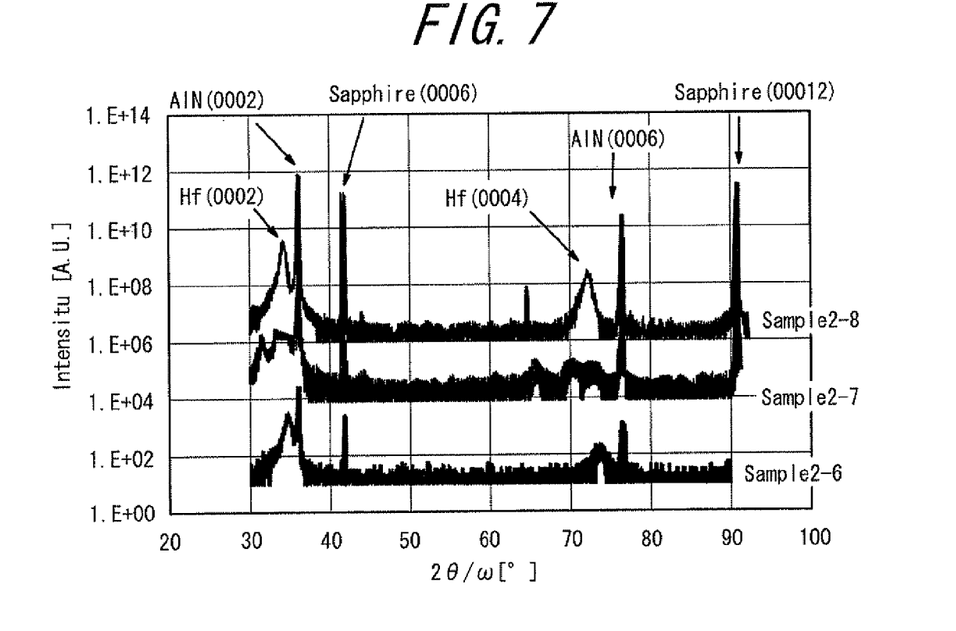
FIG. 7 is a graph illustrating the results of 2θ/ω scan measurement with an X-ray diffractometer.

As to Sample 2-6, which remains intact since a single metallic layer Hf is deposited by sputtering, it can be found that Sample 2-6 assumes some crystal orientation as illustrated in FIG. 7, but exhibits a diffraction peak at a position different from that of Sample 2-8. Sample 2-7 exhibits many diffraction peaks from HfN and is found to be in a polycrystalline state. Sample 2-8 exhibits diffraction peaks of Hf (0002) and (0004). It is then found that Hf metal is crystallized through heat treatment under a hydrogen atmosphere.

Figure 8:
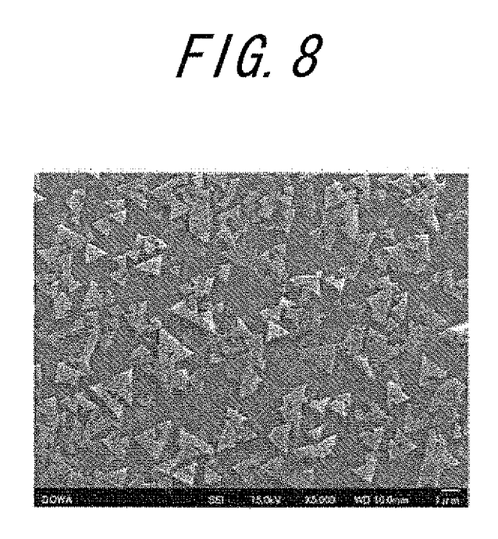
FIG. 8 illustrates a surface SEM image of a sample according to a conventional example.

The results of observing the surface of Sample 2-11 with SEM that is nitrided at a temperature equal to or greater than the melting point of CrN are illustrated in FIG. 8. Cr is nitrided, and there are randomly scattered objects coagulated in a triangular and trapezoidal pattern. It is also found that the coverage by CrN decreases and that the underlying MN template is largely exposed.

The results of surface flatness evaluation conducted on the AlN buffer layers of Samples 2-4, 2-5, 2-9, 2-10 and 2-12 by means of X-ray rocking curve measurement and AFM are reported in Table 3. It is found that for Zr and Hf, when performing heat treatment under a hydrogen atmosphere, substantially the same or better crystallinity is achieved and the surface flatness may be significantly improved as compared with when performing a nitridation process on metallic layers. In addition, upon immersion of Samples 2-4, 2-5, 2-9 and 2-10 in hydrofluoric acid, it is observed that metals are dissolved respectively and chemical lift-off becomes available.

In contrast, Sample 2-12, which results from nitridation of Cr to CrN, followed by growth of an AlN buffer layer at a temperature equal to or greater than the melting point of this CrN, exhibits very good crystallinity and surface flatness. However, it cannot be chemically lifted off even when immersed in Cr etching liquid. This is because the coverage by CrN decreases as illustrated in FIG. 8, and the AlN buffer layer grows directly taking over good crystallinity and flatness of the underlying AlN template.

TABLE 3

| | | XRC for AlN | | AFM | |
|---|---|---|---|---|---|
| | | (0002) | (10-12) | Ra | |
| Sample No. | Metallic Species | [arcsec] | [arcsec] | [nm] | |
| 2-4 | Zr | 119 | 1847 | 64.4 | Comp. Ex. |
| 2-5 | | 99 | 1919 | 1.4 | Example |
| 2-9 | Hf | 101 | 2456 | 43.4 | Comp. Ex. |
| 2-10 | | 108 | 1851 | 0.32 | Example |
| 2-12 | Cr | 52 | 1505 | 0.2 | Comp. Ex. |

Example 3

As is the case with Example 1, single metallic layers are deposited on the AlN template substrate by sputtering with metallic species and thickness as reported in Table 4. Then, heat treatment under a hydrogen atmosphere is performed on parts of Samples thus formed as summarized in Table 4, or alternatively, buffer layers (1 μm) made from AlN material are further deposited under certain conditions in order to obtain samples 3-2, 3-4, 3-6 and 3-8.

In addition to this, single metallic layers are deposited on a sapphire substrate, the surface of which is not subjected to nitridation process, by sputtering with metallic species and thickness as reported in Table 4. Then, heat treatment under a hydrogen atmosphere, as summarized in Table 4, is performed on parts of Samples thus formed, or alternatively, buffer layers (1 μm) made from AlN material are further deposited under certain conditions in order to obtain samples 3-1, 3-3, 3-5 and 3-7.

TABLE 4

| | | | | Heat Treatment | | | Buffer Layer | | | |
|---|---|---|---|---|---|---|---|---|---|---|
| Sample No. | Substrate | Metallic Species | Thickness (nm) | Tem. (° C.) | Press. (Torr) | Time (min) | Tem. (° C.) | Press. (Torr) | V/III ratio | |
| 3-1 | Sapphire | Zr | 20 | 1200 | 200 | 10 | | none | | Comp. Ex. |
| 3-2 | AlN template | | 20 | 1200 | 200 | 10 | | none | | Example |
| 3-3 | Sapphire | | 20 | 1200 | 200 | 10 | 1250 | 12 | 120 | Comp. Ex. |
| 3-4 | AlN template | | 20 | 1200 | 200 | 10 | 1250 | 12 | 120 | Example |
| 3-5 | Sapphire | Hf | 20 | 1200 | 200 | 10 | | none | | Comp. Ex. |
| 3-6 | AlN template | | 20 | 1200 | 200 | 10 | | none | | Example |
| 3-7 | Sapphire | | 20 | 1200 | 200 | 10 | 1250 | 12 | 120 | Comp. Ex. |
| 3-8 | AlN template | | 20 | 1200 | 200 | 10 | 1250 | 12 | 120 | Example |

(Evaluation)

Figure 9:
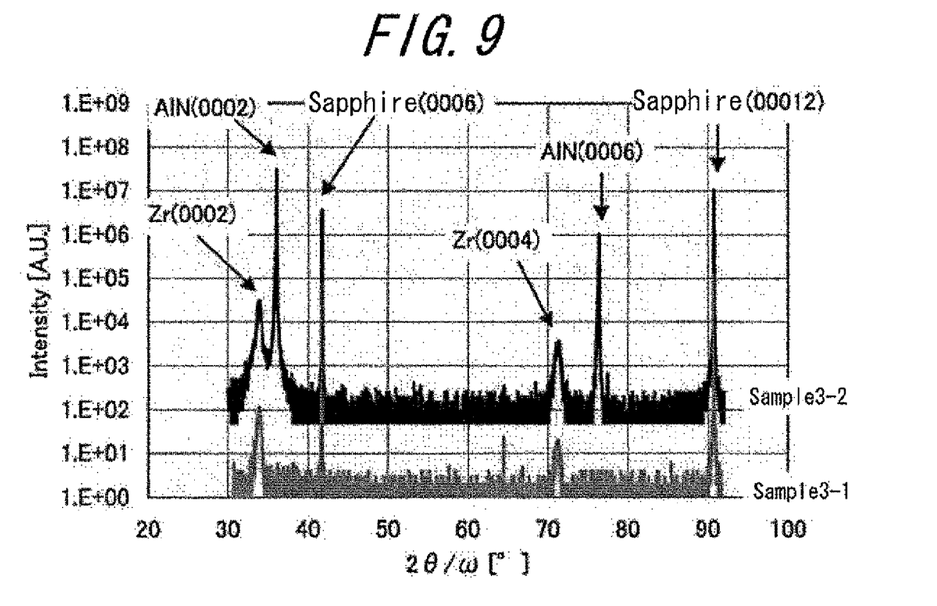
FIG. 9 is a graph illustrating the results of 2θ/ω scan measurement with an X-ray diffractometer.
Figure 10:
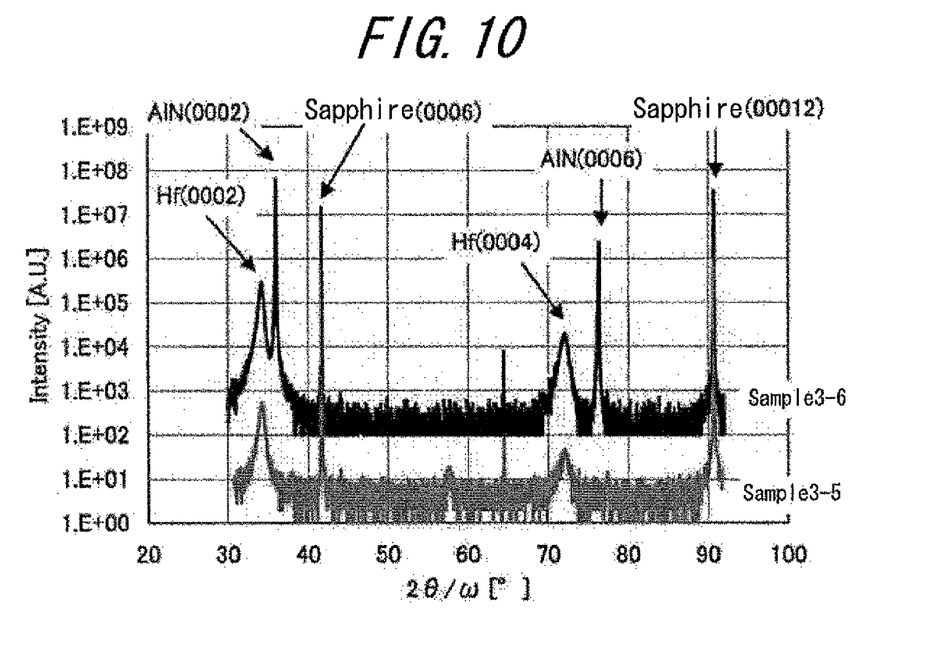
FIG. 10 is a graph illustrating the results of 2θ/ω scan measurement with an X-ray diffractometer.

To ascertain the crystallization and crystal orientation of metallic layers, 2θ/ω scan measurement is conducted on Samples 3-1, 3-2, 3-5 and 3-6 with an X-ray diffractometer. It can be seen from FIGS. 9 and 10 that the metallic films are crystallized in any of the metallic species without the AlN template.

The results of X-ray rocking curve evaluation conducted on the MN buffer layers of Samples 3-3, 3-4, 3-7 and 3-8 are reported in Table 5. In the absence of AlN single-crystal substrates under metallic layers, no peak of diffraction X-ray is observed with respect to the MN buffer layers on the metallic layers, and the AlN buffer layers are found to be in an amorphous state. Therefore, it is not sufficient to merely provide metallic layers with crystal is orientation, but rather it is possible to obtain an initial growth layer that has much better crystallinity when a single metallic layer is formed on a crystal growth substrate, at least the surface portion of which substrate includes an AlN single-crystal.

TABLE 5

| | | XRC for AlN | | |
|---|---|---|---|---|
| | | (0002) | (10-12) | |
| Sample No. | Metallic Species | [arcsec] | [arcsec] | |
| 3-3 | Zr | no peak | | Comp. Ex. |
| 3-4 | | 99 | 1919 | Example |
| 3-7 | Hf | no peak | | Comp. Ex. |
| 3-8 | | 108 | 1851 | Example |

Example 4

As is the case with Example 1, Hf is deposited to a thickness of 20 nm, as a single metallic layer, on an AlN template substrate by sputtering. Then, heat treatment is performed on Samples thus formed under a hydrogen atmosphere as reported in Table 6. Subsequently, AlN buffer layers (1 μm thick) are further deposited under certain conditions as summarized in Table 6 in order to obtain samples 4-1 and 4-2. Moreover, an AlN layer is deposited to a thickness of 100 μm on The AlN buffer layer obtained in Sample 4-1 at 1250° C. over 48 hours. It is then immersed in BHF (buffered hydrofluoric acid) to selectively etch the Hf metallic layer and peel off the growth AlN template substrate, thereby obtaining a freestanding, AlN single-crystal substrate having a diameter of 2 inches.

$Al_{0.32}Ga_{0.68}N$ to a thickness of 0.2 µm as a p-cladding layer and Mg-doped $Al_{0.25}Ga_{0.75}N$ to a thickness of 0.02 µm as a p-contact layer. As a result, a lamination layer is formed with LED (Light Emitting Diode) structure.

TABLE 6

| | | | | | | | | | | | | | |
|---|---|---|---|---|---|---|---|---|---|---|---|---|---|
| | | | | Buffer Layer | | | | | | | | | |
| | | | | | | | | 2nd Buffer Layer | | | | | |
| | | | Heat Treatment | | | 1st Buffer Layer | | Heating | | | | | |
| Sample No. | Metallic Species | Thickness (nm) | Tem. (° C.) | Press. (Torr) | Time (min) | Tem. (° C.) | Press. (Torr) | Time (min) | Time (min) | Tem. (° C.) | Time (min) | | |
| 4-1 | Hf | 20 | 1300 | 200 | 30 | 1140 | 10 | 10 | 5 | 1290 | 35 | Example |
| 4-2 | | 20 | | | | 1290 | 10 | 50 | | none | | Example |

(Evaluation)

Figure 11:
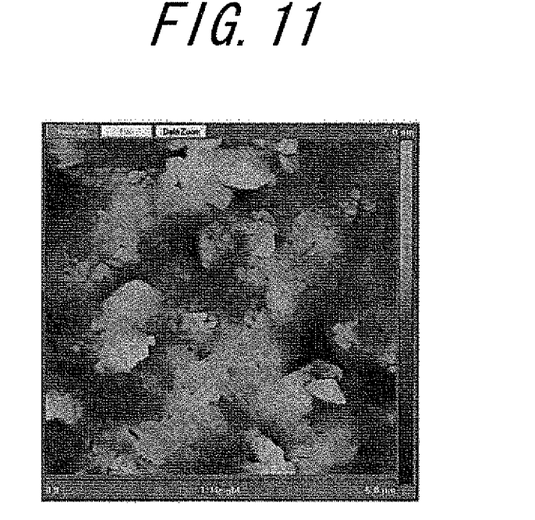
FIG. 11 illustrates a surface image of a sample according to the present invention by AFM.
Figure 12:
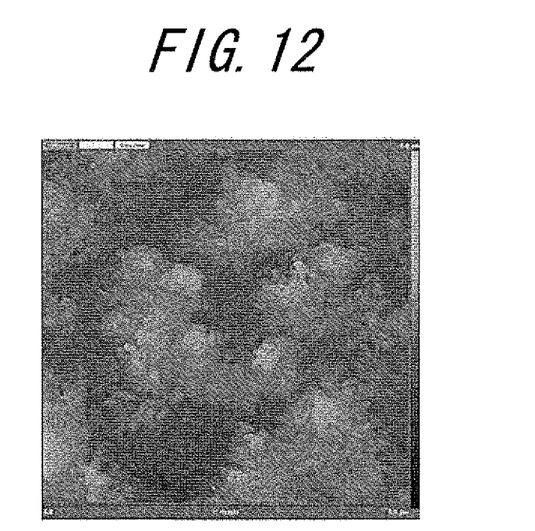
FIG. 12 illustrates a surface image of a sample according to the present invention by AFM.

X-ray rocking curve measurement and surface flatness evaluation with AFM are conducted on the AlN buffer layers. As illustrated in FIG. 11, Sample 4-2, which is grown under a single condition, involves rough parts on its surface as well as some pits thereon, whereas Sample 4-1, which is grown with the growth temperature being changed during the growth, provides a film having a very flat surface as illustrated in FIG. 12. In addition, as summarized in Table 7, the half widths of the rocking curves are equivalent to one another within measurement error, providing good crystals. As such, while it is possible to obtain a buffer layer that has good crystallinity and flatness at the atomic level by growing it under a single condition, the surface can be flattened in a much better way when increasing the growth temperature in a stepwise manner, while maintaining good crystallinity. In addition, a film can be deposited thick on a flat surface to obtain a freestanding substrate. Moreover, the AlN template substrate from which the Hf metallic layer has been etched may also be reused as the next growth substrate.

TABLE 7

| | | XRC for AlN | | AFM | |
|---|---|---|---|---|---|
| Sample No. | Metallic Species | (0002) [arcsec] | (10-12) [arcsec] | Ra [nm] | |
| 4-1 | Hf | 177 | 1677 | 0.3 | Example |
| 4-2 | | 150 | 1588 | 1 | Example |

Example 5

As is the case with Example 1, Hf is deposited to a thickness of 10 nm on the AlN template substrate by sputtering. This sample is set in the MOCVD device, and then subjected to heat treatment under a hydrogen atmosphere, at a pressure of 200 Torr and substrate temperature of 1250° C. for 10 minutes. Then, the substrate temperature is lowered to 1100° C. and ammonia gas and TMA (trimethylaluminium) are supplied so that an AlN layer is deposited to a thickness of 50 nm, which is a first buffer layer of the initial growth layer. Then, the substrate temperature is raised to 1250° C., and an AlN layer is deposited to a thickness of 900 nm, which is a second buffer layer of the initial growth layer.

Subsequently, an Si-doped $Al_{0.32}Ga_{0.68}N$ layer is deposited to a thickness of 1.3 µm at 1070° C. as an n-cladding layer, an AlInGaN MQW (Multiple Quantum Well) layer to a thickness of 0.15 µm as an emitting layer, Mg-doped In LED device processing, Hf metallic layers are removed from the side of the p-cladding layer to form the contours of individual devices (substantially 1 mm square), and groove processing is carried out by dry etching to reach the sapphire substrate. Rh (rhodium) is deposited to a thickness of 100 nm on the top surfaces of the individual devices at the side of the p-cladding layer by sputtering. Then, heat treatment is performed at 600° C. to form p-type ohmic electrodes. After said groove processing parts are filled with resists, Au is deposited by sputtering and a seed layer for electroplating is formed. Subsequently, Au is subjected to electroplating to obtain a thick film layer having a thickness of 70 µm.

The resists in the groove processing parts are removed with acetone, followed by selective etching of the Hf metallic layer with BHF (buffered hydrofluoric acid) to peel off the growth substrate. Then, the AlN layer, which is the surface to be peeled off, is removed by dry etching to expose the underlying n-cladding (contact) layer. Then, ohmic electrodes of Ti/Al are formed on that surface by sputtering and then subjected to heat treatment at 500° C., thereby obtaining LED devices with a vertical structure.

(Evaluation)

Sampling twenty of the resulting LED devices for property evaluation, it is advantageously found that the average emission wavelength is 325 nm and the average output is 73 mW for forward current of 300 mA.

While the present invention has been described in detail with reference to specific examples of the embodiments and Examples thereof, the present invention is not limited to the disclosed embodiments or Examples of the invention. Rather, any modifications and variations are possible without departing from the spirit and scope of the present invention.

INDUSTRIAL APPLICABILITY

A III-nitride semiconductor growth substrate of the present invention comprises: a crystal growth substrate, at least the surface portion of which substrate includes a III-nitride semiconductor containing Al; and a single metallic layer formed on said surface portion, the single metallic layer being made from Zr or Hf. This may suppress the reduction in surface flatness of a single metallic layer, improve the crystallinity of the metallic layer by the subsequent heat treatment as well as the crystallinity of a III-nitride semiconductor layer, $Al_xGa_yIn_{1-x-y}N$ ($0 \leq x \leq 1$, $0 \leq y \leq 1$, $0 \leq x+y \leq 1$), to be formed thereon, and allow the crystal growth substrate to be peeled off with ease from the III-nitride semiconductor layer by chemical lift-off.

In addition, according to the present invention, the III-nitride semiconductor growth substrate may be used to provide a III-nitride semiconductor epitaxial substrate, a III-nitride semiconductor element, and a III-nitride semiconductor freestanding substrate, which have good crystallinity and cover the entire wavelength range (200 nm to 1.5 µm) that can be covered by III-nitride semiconductor material beyond the wavelength limit for CrN material.

Moreover, the present invention comprises: forming a single metallic layer made from Zr or Hf material on a crystal growth substrate, at least the surface portion of which substrate includes a III-nitride semiconductor containing Al; and performing heat treatment on the single metallic layer under a hydrogen atmosphere. This enables fabrication of a III-nitride semiconductor growth substrate that may suppress the reduction in surface flatness of a single metallic layer, improve the crystallinity of a III-nitride semiconductor layer, $Al_xGa_yIn_{1-x-y}N$ ($0 \leq x \leq 1$, $0 \leq y \leq 1$, $0 \leq x+y \leq 1$), to be subsequently formed thereon, and allow the crystal growth substrate to be peeled off with ease from the III-nitride semiconductor layer by chemical lift-off.

Additionally, according to the present invention, a chemical lift-off method may be carried out by means of the III-nitride semiconductor growth substrate, which enables efficient fabrication of a III-nitride semiconductor epitaxial substrate, a III-nitride semiconductor element, and a III-nitride semiconductor freestanding substrate, which have good crystallinity and cover the entire wavelength range (200 nm to 1.5 µm) that can be covered by III-nitride semiconductor material beyond the wavelength limit for CrN material.

| REFERENCE NUMERALS | |
|---|---|
| 1 | III-nitride semiconductor growth substrate |
| 2 | Surface portion |
| 3 | Crystal growth substrate |
| 4 | Single metallic layer |
| 5 | Initial growth layer |
| 5a | First buffer layer |
| 5b | Second buffer layer |
| 6 | Base substrate |
| 7 | III-nitride semiconductor layer |
| 8 | III-nitride semiconductor epitaxial substrate |
| 9 | III-nitride semiconductor element |
| 10 | Support substrate |
| 11 | n-AlGaN layer |
| 12 | AlInGaN-based quantum well active layer |
| 13 | p-AlGaN layer |

The invention claimed is:

1. A III-nitride semiconductor growth substrate comprising:
   a crystal growth substrate, at least a surface portion of the crystal growth substrate is made from AlN; and
   a single metallic layer formed directly on the surface portion, the single metallic layer being made from Zr or Hf crystallized through heat treatment performed under a hydrogen atmosphere at temperatures between 1000 to 1300° C.; and
   an initial growth layer including at least one buffer layer made from $Al_xGa_{1-x}N$ ($0 \leq x \leq 1$) on the single metallic layer.

2. The III-nitride semiconductor growth substrate according to claim 1, wherein the single metallic layer has a thickness of 5 to 100 nm.

3. The III-nitride semiconductor growth substrate according to claim 1, wherein at least the surface portion is made from $Al_xGa_{1-x}N$ ($0.5 \leq x \leq 1$) with an Al composition of 50 at % or more.

4. A III-nitride semiconductor epitaxial substrate comprising at least one III-nitride semiconductor layer on the III-nitride semiconductor growth substrate according to claim 1.

5. A III-nitride semiconductor freestanding substrate including the III-nitride semiconductor growth substrate according to claim 1.

6. A III-nitride semiconductor element including the III-nitride semiconductor growth substrate according to claim 1.

7. The III-nitride semiconductor growth substrate according to claim 1,
   wherein the single metallic layer is crystallized through heat treatment performed at pressures between 50 to 760 Torr and for times between 1 to 60 minutes.

8. The semiconductor growth substrate according to claim 1, wherein
   the single metallic layer is selectively etched so that III-nitride semiconductor layer over the III-nitride semiconductor growth substrate is separated from the growth substrate by chemical lift-off.

* * * * *